United States Patent [19]

Burov et al.

[11] 4,075,016

[45] Feb. 21, 1978

[54] POSITIVE-WORKING PHOTOGRAPHIC PROCESS AND RADIATION ELEMENTS UTILIZING A CHALCOGENIDE OF ARSENIC IMAGING COMPOUND AND A NOBLE PLATING METAL

[75] Inventors: Atanas Tzvetanov Burov; Penka Atanassova Simidchieva; Konstantin Nikolaev Kolev, all of Sofia, Bulgaria

[73] Assignee: Ziafop pri Ban, Sofia, Bulgaria

[21] Appl. No.: 646,934

[22] Filed: Jan. 6, 1976

[30] Foreign Application Priority Data

Jan. 7, 1975 Bulgaria ................................... 2867

[51] Int. Cl.$^2$ .......................... G03C 5/24; G03C 1/48
[52] U.S. Cl. .................................. 96/48 PD; 204/15; 204/38 B; 427/343; 96/76 R
[58] Field of Search ................ 96/76 R, 48 PD, 48 R, 96/88, 1.5; 204/15, 38 B; 427/343

[56] References Cited

U.S. PATENT DOCUMENTS

| | | | |
|---|---|---|---|
| 3,658,540 | 4/1972 | Malinowski | 96/48 PD |
| 3,707,372 | 12/1972 | Hallman et al. | 96/1.5 |
| 3,829,317 | 8/1974 | Case | 96/48 PD |
| 3,907,566 | 9/1975 | Inoue et al. | 96/48 PD |
| 3,923,512 | 12/1975 | Berkes et al. | 96/88 |
| 3,933,496 | 1/1976 | Kolev et al. | 96/48 PD |

*Primary Examiner*—Won H. Louie, Jr.
*Attorney, Agent, or Firm*—Finnegan, Henderson, Farabow & Garrett

[57] ABSTRACT

Radiation sensitive elements comprising a thin radiation sensitive layer of an amorphous chalcogenide of arsenic adhering to a substrate are utilized in the production of latent images when exposed to a suitable form of radiation, the latent images being developed by utilizing the inability of radiation exposed arsenic chalcogenide to cause reduction of noble metal salts. Noble metal salts are thus decomposed by arsenic chalcogenide which has not been exposed to radiation to form a direct positive image which can subsequently be intensified by physical development and/or electroless deposition of metal possibly followed by electrolytic deposition of metal. The form of radiation employed is generally visible light and diverse procedures for producing direct positive images are disclosed.

37 Claims, No Drawings

POSITIVE-WORKING PHOTOGRAPHIC PROCESS AND RADIATION ELEMENTS UTILIZING A CHALCOGENIDE OF ARSENIC IMAGING COMPOUND AND A NOBLE PLATING METAL

BACKGROUND OF THE INVENTION

This invention relates to a method for the production of a direct positive image and to a radiation sensitive element for use therein.

A number of methods for obtaining latent positive images are known. Thus for example United Kingdom patent specifications Nos. 1,151,310 and 1,376,826 require the use of a material comprising a combination of thin evaporated layers of a metal compound and a radiation sensitive substance on a substrate. Upon exposure of the material to radiation the metal layer is destroyed due to its chemical interaction with the products of the radiation-induced decomposition of the radiation sensitive substance in areas on which radiation, usually light, is incident. This provides a latent image which is subsequently developed to render it visible by utilising metal which remains intact to catalyst the selective decomposition of a metal compound deposited by conventional development or thermodeposition. This deposited metal constitutes a direct image. To produce the starting photographic material, however, it is necessary to achieve controlled evaporation and condensation on a substrate of metal and light sensitive substance in a definite ratio, which is generally a difficult matter to achieve. Moreover, the exposed material undergoes a particularly complicated treatment since it is necessary to achieve selective dissolution of the product of the reaction without affecting the latent metal image constituted by residual metal.

In a number of patent specifications, for example British patent specification No. 1,043,250, a method for the production of a metal image is described which utilises the ability of some metal oxides and sulphides to form a latent image on exposure to radiation, which image is formed of a material which catalyzes the deposition of a metal from the solution of a physical developer. A shortcoming of this method is that the latent image obtained disappears very quickly after illumination. Furthermore, the photographic material used is an emulsion and hence contains an organic substance as binder. Many of these materials are undesirable in some cases and their presence considerably complicates the production processes for the starting materials.

German Offenlegungsschriften Nos. 2,236,298 and 2,249,825 describe light sensitive materials which yield a metal image after exposure and suitable treatment. These photographic materials comprise halides or chalcogenides doped with metals and prepared in the form of an emulsion or thin evaporated layer. On exposure, the metal diffuses through the thickness of photographic material in the illuminated areas and the metal remaining on the non-illuminated areas is then removed by dissolution. Physical development is then effected to produce a metal image using the metal remaining in the photographic material as catalyst. As in British patent specifications Nos. 1,151,310 and 1,376,876 problems are encountered in the combining of two active materials, the light sensitive substance and the metal. In addition, a great part of the previously coated metal is lost when fixing the exposed material, so that the process is particularly expensive.

Finally, U.S. Pat. No. 3,707,372 describes an electromagnetic radiation sensitive element comprising a layer of inorganic material capable when exposed to electromagnetic actinic radiations of exhibiting physical and chemical characteristics different from those of the material not exposed to such radiations which material is inter alia an arsenic sulphide. These different properties may result from reaction of exposed material with a metal layer thereadjacent. Thus, when the element is exposed, for example to light, with an intensity and for a period of time sufficient to cause the different physical and chemical characteristics to appear, it becomes possible to utilize these different characteristics for specific purposes. In particular, differential solubility in a particular solvent may be used to remove either unexposed material or exposed material or different hydrophilic or oleophilic characteristics of the exposed and unexposed materials may be utilised in the production of a lithographic plate.

OBJECTS OF THE INVENTION

It is an object of the present invention to provide a method for the production of a direct positive metal image which is fixed to the substrate using a radiation sensitive layer consisting of one active component only, which image can be obtained after comparatively simple and cheap processing.

Another object of the invention is the provision of a photographic material suitable for use in the method as aforesaid.

SUMMARY OF THE INVENTION

According to one aspect of the present invention there is provided a method for the production of a direct positive metal image, which comprises exposing an element comprising a thin radiation sensitive layer of an amorphous chalcogenide of arsenic adhering to a carrier therefor to radiation through a photomask to form a latent positive image, the radiation being such as to render chalcogenide impinged on thereby incapable of reducing a noble metal to form a deposit of the noble metal, immersing the element in a solution of a noble metal salt to deposit said noble metal in non-irradiated areas and obtaining a direct image rendered visible by means of said noble metal.

According to a second aspect of the invention there is provided a radiation sensitive element for use in the production of a direct positive metal image when exposed to radiation through a photomask and immersed in water, which comprises a substrate having adhering thereto a thin radiation sensitive layer of an amorphous chalcogenide of arsenic which is covered in turn by a layer of a water permeable organic material and by a layer of a water soluble organic polymer containing a noble metal salt, the radiation sensitive layer being accessible to radiation from one or both sides thereof.

The present invention is based on a phenomenon hitherto undescribed and observed by us when studying the properties of evaporated thin layers of amorphous chalcogenide semi-conductors of the system, e.g. arsenic - sulphur. It is well established that on dipping in a solution of silver nitrate, arsenous sulphide reduces the silver ions whereby a black to brown layer of silver is deposited on the sulphide. It has now been found that on subjecting the arsenous sulphide to actinic radiation, in particular light, this property is reduced or completely lost. Hence, if an evaporated layer of arsenous sulphide is illuminated through a suitable mask and is then dipped in a solution of silver nitrate, there is obtained a direct positive image having great optical density. The use of salts of noble metals other than silver, for example palladium dichloride or gold perchloride is also possible. With these latter metals, as well as with silver nitrate when used for a sufficiently short time, a form of image is obtained which can be intensified subsequently by means of a physical developer or an electroless plating bath using the deposited metal as activater. The change in the reduction capacity of the amorphous arsenous chalcogenide is preserved even when the arsenous chalcogenide layer is partially dissolved away in a suitable solvent, showing that this property is connected with changes in the volume of the layer of the chalcogenide rather than chemical changes.

This behaviour is to be distinguished from that of the elements of U.S. Pat. No. 3,707,372 in which different physical characteristics imparted to radiation sensitive material by irradiation are utilised. If any chemical reaction is to occur as a result of irradiation, it occurs between irradiated light sensitive material and material in a layer thereadjacent. In contrast, the present invention is based on the observation that the irradiated light sensitive material is rendered incapable of reaction with a noble metal salt to cause deposition of noble metal to intensify the latent image formed or act as catalyst for deposition of metal in unexposed areas whereby a direct positive image is produced.

DETAILED DESCRIPTION OF THE INVENTION

The starting material used to produce a latent positive image may be produced by providing a substrate by dipping or coating with a layer of an adhesive, for example a polyacrylonitrile type adhesive such as the product Bondmaster 036-0103 of National Adhesives Ltd., a thermoplastic sodium butadiene rubber type of adhesive such as 200 TF of Shipley Ltd. or the product Novoprint of Schering AG. It is also possible to use a glass substrate covered with a layer of vacuum evaporated cadmium fluoride or chromium, or a substrate formed of anodized aluminium, such as used in the lithographic industry for making printing forms, roughened metal substrates and substrates formed of polyester or epoxy resin. Onto the subbed and, where relevant dried substrate, is then deposited, by cathode sputtering, or more particularly by vacuum evaporation a thin vitreous layer of chalcogenide of arsenic. Usually one of the following combinations will be employed: As—S, As—Te, As—S—Te, As—S—Se, As—S—Se—Te. The vitreous content of the chalcogenide layer preferably consists of the system As—S in the range of from 40% As—60% by weight S to 70% by weight As to 30% by weight S. Vacuum deposition can be carried out in a conventional vacuum apparatus working at a vacuum of for example $5 \times 10^{-5}$ Torr. The thickness of the layer formed is not of essential importance and can vary from several Angstroms to several millimeters.

The radiation sensitive material thus obtained is then ready for use. It can thus be exposed through a transparency and the latent image formed developed. Development can be effected with or without previous partial dissolution of the layer of arsenous chalcogenide. In the latter case the development of the latent image can be effected by dipping the exposed material in a concentrated solution of silver nitrate whereby the non-irradiated areas are covered with a black-to-brown layer of silver. However, in the former case the chalcogenide layer is partially dissolved away in for example a dilute solution of an alkali metal base or concentrated ammonia solution. After rinsing in distilled water, the material is activated by dipping in a solution of a salt of a noble metal, for example silver nitrate, gold perchloride or palladium dichloride whereby the corresponding metal is deposited on the non-irradiated areas. The thin deposit of noble metal catalyzes the subsequent deposition of metal from any conventional bath for chemical metalisation. Thus, depending on the bath chosen, the positive image obtained can be built up for example of copper, chromium, nickel, iron, cobalt, silver or tin, or of a combination of metals. This makes the method of this invention applicable to the production of particular products required in the electronics industry where it is necessary to have selective deposition of metals or a combination of metals having for example magnetic or superconductive properties. When sufficient metal has been deposited, the image becomes electroconductive. This, together with the good adhesion of the metal image to the substrate makes the method especially suitable for preparing printed circuits for use in the electronics industry on any kind of substrate, including flexible substrates.

The dissolution of part of the radiation sensitive layer after exposure makes it possible for the metal deposited to come into intimate contact with the subbed substrate during intensification of the image so that it becomes firmly bound to the substrate. Furthermore, this treatment of the exposed material makes it insensitive to radiation. In addition, if the image obtained is used as a transparency for copying, then, after the dissolution out of chalcogenide, the contrast and the spectral region of transmittance of the transparency itself is increased since the chalcogenide absorbs the ultraviolet part of the spectrum.

Although in the foregoing description it is assumed that substances necessary for intensification of the latent image are employed in treatment solutions, they can be incorporated in a radiation sensitive element thereby simplifying the production of a direct positive image by the use of the present invention. In such case the radiation sensitive layer is covered with a protective layer of a water permeable organic substance, for example gelatin, onto which is coated a layer of water soluble polymer, for example polyvinyl alcohol containing a salt of a noble metal.

After exposure of the radiation sensitive element thus obtained, it is dipped in water to provide automatically a solution of activating salt which enables activation of the image to take place. Thus, only a single true operation is required for intensification purposes, preferably a physical development or electroless plating operating being employed. A combination of these methods or electrolytic deposition effected subsequently may be used to further intensify the image.

By operating in accordance with this invention, in contrast to using the materials of British patent specifications Nos. 1,151,310 and 1,376,836 it is possible to provide particularly simply the basic radiation sensitive material owing to its only having a single active components. Hence, the chemical treatment of the exposed material is much simplified, avoiding the use of toxic selective solvents. All this facilitates the production of a variety of products and extends substantially the possibilities for practical application of this invention.

Since the radiation sensitive layer does not contain an organic binding substance, a radiation sensitive layer can be particularly thin and optically homogeneous thereby enabling higher resolution to be obtained. Furthermore, no treatment is required immediately after exposure to stabilise the latent image since the latent image does not deteriorate rapidly with time.

In addition the difficulties of effecting doping with metal or metal ions according to German Offenlegungsschriften Nos. 2,236,298 and 2,249,825 which difficulties are similar to those encountered when working in accordance with British patent specifications Nos. 1,151,310 and 1,376,836 are now avoided. Besides, as mentioned above, wastage of silver is avoided, which makes the present method considerably cheaper to operate. In addition, when the activating salt is incorporated with the photosensitive layer in the photographic material, development and intensification are much simplified.

The following examples illustrate the invention:

EXAMPLE 1

A layer of vitreous arsenous sulphide was deposited onto an insulating substrate. Glass, polyester film or barite paper may be used for this purpose. A deposition was carried out by evaporation of the sulphide from a quartz crucible in a conventional vacuum plant working at $5 \times 10^{-5}$ Torr. An arsenous sulphide layer with a thickness corresponding to a deposition of about $1 \times 10^{-5}$ g/cm$^2$ of arsenous sulphide was obtained at a crucible temperature of about 250° C after 4 minutes.

The photographic material thereby obtained was exposed for 30 sec. to a collimated beam from a 40 W mercury lamp through a transparency, and a positive latent image was obtained.

Development of the image was carried out by dipping the material for 30 sec. in a freshly prepared 65% by weight solution of silver nitrate. This resulted in the non-illuminated areas being darkened by silver formed by decomposition of the silver nitrate while on the illuminated areas was left a transparent light yellow layer of arsenous sulphide. In this way a direct positive image of the transparency was obtained.

After development, the material was well washed in water and dried. The optical density thereof was then measured and gave the values $D_{max} = 3.5$ and $D_{min} = 0.6$ (the optical density of the transparent sulphide layer).

EXAMPLE 2

A layer of arsenous sulphide was deposited by vacuum evaporation in the manner indicated in Example 1 onto a substrate, subbed with a thin layer of adhesive resin, the product "Bondmaster 036-0103" of National Adhesives Ltd. At a crucible temperature of about 230° C there was obtained after 30 sec. an arsenous sulphide layer with a thickness corresponding to deposition of $1.10^{-6}$ g/cm$^2$ of arsenous sulphide.

The photographic material thereby obtained was exposed through a transferency for 30 sec. to a 100 W Xenon lamp at a distance of 16 cm and then was immersed for 30 sec. to 1 min. in a 1% by weight solution of sodium hydroxide to brighten markedly the sulphide layer in the illuminated areas. After washing the material well in distilled water, it was activated by immersion for about 15 sec. in a solution with a composition PdCl$_2$ : 0.26 g
HCl (conc.): 2.5 ml
distilled water : up to 1 liter and the latent image produced was developed by immersion in a chemical metalisation bath having the composition CuSO$_4$.5H$_2$O : 10 g
NaOH : 17 g
K$_2$CO$_3$ : 4 g
Seignette salt : 50 g
EDTA : 0.7 g
distilled water : up to 900 ml Before use 100 ml of 36-38% by weight formalin were added to the chemical metalisation bath with stirring. After about 60 to 90 sec. at room temperature a direct positive copper image of the transparency copied was obtained.

EXAMPLE 3

A substrate coated with a thin layer of an adhesive (for example "Bondmaster 036-0103", or "Shipley 200 TF", a product of Shipley Ltd., etc.) was provided with a layer of As-S in which the As/S ratio lay in the range 40% As-60% S to 70% As-30% S by weight, in the manner described in Example 2. Polyester film, glass or glass-fibre-reinforced resin could be used as substrate. The adhesive could be formed of the aforementioned Bondmaster 036-0103 or of Shipley 200 TF, a product of Shipley Ltd.

After imagewise exposure under the conditions set out in Example 2 and dissolution of part of the layer of light sensitive substance in a 1% by weight solution of sodium hydroxide by immersion for 2 min., development of the latent image produced was carried out in two stages, namely:

1. dipping for 1 min. in a 65% by weight solution of silver nitrate and washing for 30 sec. in distilled water; and then 2. dipping for 15 sec. at room temperature in a freshly prepared solution of a physical developer prepared by mixing 50 parts by volume of the following solution A with 1 part by volume of the following solution B before use. The solutions had the following compositions:

| Solution A | | Solution B | |
| --- | --- | --- | --- |
| Metol | 8.3 g | AgNO$_3$ | 30 g |
| Citric Acid | 8.3 g | Distilled water | 45 ml |
| Glacial acetic acid | 41.7 g | | |
| Gelatin | 6.7 g | | |
| Distilled water | up to 1 liter | | |

A direct positive silver image was obtained.

EXAMPLE 4

A photographic material of the type produced and used in Example 3 was exposed for 20 sec. through a transparency to a 100 Watt Xenon lamp disposed at a distance of 16 cm.

Immediately after exposure the material was processed for 1 minute in concentrated ammonia solution at ambient temperature. After abundant washing in distilled water the material was developed in the physical developer used in Example 3, after previous activation for 30 to 45 sec. by immersion in the palladium dichloride solution used in Example 2.

EXAMPLE 5

An insulating substrate, which can be formed of a material available under one of the Registered Trade Marks Mylar and Hostpan, was first rendered hydrophilic by treatment with a solution of β-chlorophenol in 1,1,2,2-tetrachlorethane. A light sensitive layer was then built up on the substrate under the evaporation conditions described in Example 2.

The material obtained was then subjected to imagewise exposure as described in Example 4. After exposure the material was immersed for a short time, that is less than 30 sec., in a 1% by weight solution of sodium hydroxide, before being washed well in distilled water and developed by dipping for 90 to 120 sec. in a 70% by weight solution of silver nitrate. The positive image obtained had a grey-brownish colour and great optical density.

EXAMPLE 6

A layer of arsenous sulphide was evaporated in a conventional vacuum plant operated at a vacuum of $5 \times 10^{-5}$ Torr and deposited on a polyester film of the type "Melinex S" (a product of Imperial Chemical Industries, Ltd.), subbed with a thin layer of an adhesive resin product "200TF" of Shipley Ltd. For this purpose, there was used a quartz crucible having a temperature of about 220° C and an evaporation time of about 90 sec. The layer of arsenous sulphide which was obtained had a thickness corresponding to deposition in an amount of $5 \times 10^{-7}$ g/cm$^2$.

The photosensitive material thus obtained was exposed for 15 sec. through a transparency to a collimated beam from a 100 W xenon lamp disposed at a distance of 16 cm. It was then immersed for 15-20 sec. in a 0.5% by weight solution of sodium hydroxide to dissolve out some of the layer of light sensitive substance.

After careful washing in distilled water the material was activated for 45 sec. in a solution of palladium dichloride having the composition set out in Example 2. After re-washing in distilled water, the material was developed for 30 sec. in the physical developer of Example 3, diluted with water in the volume ratio 2:1.

The image obtained was then intensified in the chemical metalisation bath used in Example 2, whereby a copper electroconductive image was obtained.

There was thus employed a method which, if the transparency were of a printed circuit with connections, would yield a printed circuit. Because the copper image could be thickened further by quicker and cheaper electrolytic deposition of copper, the copper coated material can be utilised in a subsequent electrolytic deposition process using for example as bath "Cupracid 66", a product of Schering AG. The copper film obtained is 20-25 microns thick and its adhesion to the polyester substrate is very good. The adhesion measured for peeling off the film from the substrate is 550 to 700 g per cm.

EXAMPLE 7

The photographic material prepared, exposed and treated in sodium hydroxide as described in Example 6, was processed for 90 sec. in a solution of palladium dichloride, washed in distilled water and developed for 15 sec. in a freshly prepared 65% solution of silver nitrate.

After re-washing in distilled water and drying in a stream of warm air, the positive silver image obtained is suitable for electrolytic thickening by deposition of silver from a silver salt-containing electrolyte.

EXAMPLE 8

The photographic material prepared, exposed and treated with sodium hydroxide and a solution of palladium dichloride, as described in Example 6, was developed in a bath for chemical nickel plating having the following composition:

$NiCl_2.6H_2O$ : 30 g
Sodium citrate: 88 g
$NaH_2PO_2$ : 20 g
$NH_4Cl$ : 50 g
$NH_4OH$ (25%): 25 ml
distilled water up to 1 liter The working temperature of the bath was 28° C.

A positive nickel image of the transparency copied was obtained, which can be further thickened by 3electrolytic nickel plating.

EXAMPLE 9

A glass fibre-reinforced epoxy resin laminate was given a thin coating of vitreous $As_2S_5Te$ by cathode sputtering in argon atmosphere at a pressure of $10^{-2}$ Torr. A coating layer 0.06 to 0.1 microns thick was thereby obtained.

The light sensitive material thus obtained was exposed through a transparency in the manner described in Example 6, treated with sodium hydroxide solution and activated and intensified in the manner described in Example 6.

EXAMPLE 10

An anodized aluminium substrate of the type used for printing forms in the lithographic industry was coated with about 10 − 4 g per m$^2$ of arsenous sulphide by evaporation of the latter and deposition in a vacuum. The light sensitive photographic material obtained was exposed for 3 minutes to a 1000 watt Halogen lamp through a suitable raster screen. The exposed sample was immersed for 1-3 seconds in a 1% by weight solution of sodium hydroxide and was then washed well in water. The image obtained was activated by dipping for 4-5 sec. in a 60% by weight solution of silver nitrate and was then dipped in the physical developer of the type used in Example 3 to obtain a silver image with high optical density. The silver image had oleophilic properties and was acceptable to printing inks. In order to improve the hydrophilic properties of the substrate in the illuminated areas, it was again dipped in a solution of sodium hydroxide and rinsed in water. After immersion in a mercaptan/lacquer dispersion and in printing ink, it is possible to perform printing on paper using the material thereby obtained.

If instead of physical development, a bath for electroless copper deposition is used, the copper image obtained has similar properties to those of the silver image.

EXAMPLE 11

Arsenous sulphide was evaporated onto a polyester substrate covered with an adhesive by the procedure of Example 1. The As-S layer was then overcoated with a thin gelatin film by dipping in a 2.5% by weight solution of gelatin. After drying, a layer of polyvinyl alcohol containing silver nitrate was applied. A 30% by weight aqueous solution of silver nitrated mixed with a 2% solution of polyvinyl alcohol can be employed. After drying, a photographic material was obtained which was exposed as in Example 1. The activation was performed simply by dipping for 30–40 sec. in water. The positive metal image thus obtained was then intensified for example with a physical developer of the type used in Example 2. Finally, the product obtained was immersed in a 2% by weight solution of potassium hydroxide to remove the excess arsenous sulphide.

We claim:

1. A method for the production of a direct positive metal image which comprises exposing an element comprising a thin radiation sensitive layer of an amorphous chalcogenide of arsenic adhering to a carrier therefor to radiation through a photomask to form a latent positive image, the radiation being such as to render chalcogenide impinged on thereby incapable of reducing a noble metal salt to form a deposit of the noble metal and immersing the element in a solution of a noble metal salt to deposit said noble metal in non-irradiated areas to obtain thereby a direct image rendered visible by means of said noble metal.

2. A method as claimed in claim 1, wherein said amorphous chalcogenide of arsenic comprises the system As—S, As—Te, As—S—Se, As—S—Te or As—S—Se—Te.

3. A method as claimed in claim 2, wherein the amorphous chalcogenide of arsenic consists of the system As—S whose content of vitreous chalcogenide ranges from 40% by weight arsenic — 60% by weight sulphur to 70% by weight arsenic — 30% by weight sulphur.

4. A method as claimed in claim 1, wherein said noble metal salt is silver nitrate, palladium dichloride or gold perchloride.

5. A method as claimed in claim 4, wherein said chalcogenide is an arsenic sulphide and said noble salt is silver nitrate which is decomposed on contact by that chalcogenide which has been exposed to said radiation in such quantity as to render visible the latent image.

6. A method as claimed in claim 4, wherein said latent image is rendered visible by utilising said deposit of noble metal in a physical development process for deposition of additional metal.

7. A method as claimed in claim 1, wherein further metal is deposited by electroless deposition in areas where noble metal has been deposited, to intensify said image.

8. A method as claimed in claim 7, wherein further metal is deposited electrolytically in areas where noble metal has been deposited, to intensify said image.

9. A method as claimed in claim 1, wherein, after exposure, the element is immersed in an alkaline solution to reduce the thickness of said chalcogenide layer.

10. A method for the production of a direct positive metal image, which comprises exposing to light through a photomask an element comprising a thin radiation sensitive layer of an amorphous chalcogenide of arsenic bonded to a carrier therefor to form a latent positive image in unexposed areas of said layer, exposed areas of said layer being rendered incapable of reducing a noble metal salt to form a deposit of the noble metal and immersing the element in a solution of a noble metal salt to deposit said noble metal in non-irradiated areas to obtain thereby a direct image rendered visbile by means of said noble metal.

11. A method as claimed in claim 10, wherein the amorphous chalcogenide of arsenic comprises the system As—S, As—Te, As—S—Se, As—S—Te, or As—S—Se—Te.

12. A method as claimed in claim 11, wherein the amorphous chalcogenide of arsenic consists of the system As—S whose content of vitreous chalcogenide ranges from 40% by weight arsenic—60% by weight sulphur to 70% by weight arsenic — 30% by weight sulphur.

13. A method as claimed in claim 10, wherein the layer formed of an amorphous chalcogenide of arsenic is bonded to the substrate by means of a polyacrylonitrile adhesive or a thermoplastic sodium butadiene rubber adhesive.

14. A method as claimed in claim 10, wherein said noble metal salt is silver nitrate, palladium dichloride or gold perchloride.

15. A method as claimed in claim 14, wherein said chalcogenide is an arsenic sulphide and said noble salt is silver nitrate which is decomposed on contact by that chalcogenide which has been exposed to said radiation in such quantity as to render visible the latent image.

16. A method as claimed in claim 10, wherein said image is intensified by utilising deposited noble metal in a physical development process for the deposition of additional metal.

17. A method as claimed in claim 10, wherein further metal is deposited by electroless deposition in areas where noble metal has been deposited to intensify the image.

18. A method as claimed in claim 17 wherein further metal is deposited electrolytically in areas of electrolessly deposited metal to intensify further the image.

19. A method as claimed in claim 10 wherein after exposure, the element is immersed in an alkaline solution to reduce the thickness of said chalcogenide layer.

20. A method for the production of a direct positive metal image, which comprises exposing to light through a photomask, a thin layer of an amorphous chalcogenide of arsenic adhering to a carrier therefor and coated in turn with a layer of a water permeable organic material and with a layer of a water soluble organic polymer containing a noble metal salt and immersing the thus exposed element in water to achieve deposition of noble metal in areas of the element capable of reacting with the noble metal salt to obtain thereby a direct image rendered visible by means of said noble metal.

21. A method as claimed in claim 20, wherein the amorphous chalcogenide of arsenic comprises the system As—S, As—Te, As—S—Se, As—S—Te, or As—S—Se—Te.

22. A method as claimed in claim 21, wherein the amorphous chalcogenide of arsenic consists of the system As—S whose content of vitreous chalcogenide ranges from 40% by weight arsenic—60% by weight sulphur to 70% by weight arsenic — 30% by weight sulphur.

23. A method as claimed in claim 20, wherein said noble metal salt is silver nitrate, palladium dichloride or gold perchloride.

24. A method as claimed in claim 23, wherein, subsequent to immersion of said element in water, additional deposition of metal in areas carrying a deposit of the noble metal is carried out by physical development.

25. A method as claimed in claim 23, wherein, subsequent to immersion of said element in water, additional deposition of metal in areas carrying a deposit of the noble metal is carried out by electroless metal deposition.

26. A method as claimed in claim 20, wherein, subsequent to immersion of said element in water, additional deposition of metal in areas carrying a deposit of the noble metal is carried out by electrolytic metal deposition.

27. A radiation sensitive element for use in the production of a direct positive metal image when exposed to radiation through a photomask and immersed in water, which comprises a substrate having adhering thereto a thin radiation sensitive layer of an amorphous chalcogenide of arsenic which is covered in turn by a layer of a water permeable organic material and by a layer of a water-soluble organic polymer containing a noble metal salt, the radiation sensitive layer being accessible to radiation from one or both sides thereof.

28. An element as claimed in claim 27, wherein the amorphous chalcogenide of arsenic comprises the system As—S, As—Te, As—S—Se, As—S—Te, or As—S—Se—Te.

29. An element as claimed in claim 27, wherein the amorphous chalcogenide of arsenic consists of the system As—S whose content of vitreous chalcogenide ranges from 40% by weight arsenic-60% by weight sulphur to 70% by weight arsenic — 30% by weight sulphur.

30. An element as claimed in claim 27, wherein said noble metal is silver nitrate, palladium dichloride or gold perchloride.

31. An element as claimed in claim 27, wherein said water permeable substance is gelatine.

32. An element as claimed in claim 27, wherein said water soluble organic polymer is polyvinyl pyrrolidone.

33. A light sensitive element for use in the production of a direct positive metal image when exposed to light through a photomask and immersed in water, which comprises a substrate having bonded thereto by means of an adhesive layer a thin light sensitive layer of an amorphous chalcogenide of arsenic which is covered in turn by a layer of a water permeable organic material and by a layer of a water soluble organic polymer containing a noble metal salt, the amorphous arsenic chalcogenide light sensitive layer being accessible to light from one or both sides thereof.

34. An element as claimed in claim 33, wherein said noble metal salt is silver nitrate, palladium dichloride or gold perchloride.

35. An element as claimed in claim 33, wherein the adhesive is a polyacrylonitrile adhesive or a thermoplastic sodium butadiene rubber adhesive.

36. An element as claimed in claim 33, wherein said water permeable substance is gelatine.

37. An element as claimed in claim 33, wherein said water soluble organic polymer is polyvinyl pyrrolidone.

* * * * *

UNITED STATES PATENT AND TRADEMARK OFFICE
CERTIFICATE OF CORRECTION

PATENT NO. : 4,075,016
DATED : February 21, 1978
INVENTOR(S) : Atanas Tzvetanov Burov et al.

It is certified that error appears in the above-identified patent and that said Letters Patent are hereby corrected as shown below:

Under Foreign Application Priority Data the application number of the Bulgarian priority document should read "28673" rather than "2867".

Signed and Sealed this

Thirteenth Day of February 1979

[SEAL]

Attest:

RUTH C. MASON
*Attesting Officer*

DONALD W. BANNER
*Commissioner of Patents and Trademarks*